(12) United States Patent
Lee

(10) Patent No.: US 7,196,551 B2
(45) Date of Patent: Mar. 27, 2007

(54) CURRENT MODE LOGIC BUFFER

(75) Inventor: Kochung Lee, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 40 days.

(21) Appl. No.: 10/856,100

(22) Filed: May 28, 2004

(65) Prior Publication Data

US 2005/0264321 A1   Dec. 1, 2005

(51) Int. Cl.
*H03K 19/20* (2006.01)
(52) U.S. Cl. .................... 326/115; 326/86; 326/127
(58) Field of Classification Search ............. 326/115, 326/86, 127; 327/408, 433
See application file for complete search history.

(56) References Cited

U.S. PATENT DOCUMENTS

| | | | | |
|---|---|---|---|---|
| 5,355,035 A | * | 10/1994 | Vora et al. | 327/433 |
| 5,406,133 A | * | 4/1995 | Vora et al. | 327/108 |
| 5,668,495 A | * | 9/1997 | Vora et al. | 327/432 |
| 6,614,291 B1 | * | 9/2003 | Zhao et al. | 327/408 |
| 6,680,625 B1 | * | 1/2004 | Lee et al. | 326/115 |
| 6,847,225 B2 | * | 1/2005 | Viehmann et al. | 326/30 |
| 6,975,132 B2 | * | 12/2005 | Groen et al. | 326/27 |

* cited by examiner

*Primary Examiner*—Jean Bruner Jeanglaude
(74) *Attorney, Agent, or Firm*—MacPherson Kwok Chen & Heid LLP; Greg J. Michelson

(57) ABSTRACT

Systems and methods provide current mode logic buffers and interface circuits. As an example, in accordance with an embodiment of the present invention, a CML buffer is disclosed that receives and/or provides multiple signal pairs having different common mode voltages to operate over a wider common mode voltage range.

22 Claims, 9 Drawing Sheets

| FIG. 6a | FIG. 6b |
| KEY TO FIG. 6 | |

CURRENT MODE LOGIC BUFFER

TECHNICAL FIELD

The present invention relates generally to electrical circuits and, more particularly, to buffers and interface circuits.

BACKGROUND

Current mode logic is a known protocol for high-speed signal transmission and circuit interfacing. One drawback emerging for current mode logic (CML) systems is that, as the semiconductor processing technologies advance (e.g., towards 90 or 65 nm processing), the threshold voltage ($V_T$) for transistors within the CML system are reduced and may be less than a typical CML voltage swing. Due to the low threshold voltage ($V_T$), which may also vary by a wide range over process, voltage, and temperature (PVT) conditions, the common mode range and the gain of the CML system may be limited, especially if the CML voltage swing varies.

As an example, FIG. 1 illustrates a conventional CML system 100. System 100 includes a driver 102 (an output circuit), which receives input signals 106 and provides signals 118, and a receiver 104 (an input circuit), which receives signals 118 and provides output signals 110. Driver 102 includes resistors 116 (each having resistance R1), a differential transistor pair 114, and a current bias transistor 112 (controlling a current I1). Receiver 104 includes resistors 120 (each having resistance R2), a differential transistor pair 122, and a current bias transistor 124 (controlling a current I2). A supply voltage (labeled Vdd) is provided to resistors 116 and 120 and a reference voltage (e.g., ground) is coupled to transistors 112 and 124, with a control signal 108 controlling the current level for the currents I1 and I2 through corresponding current bias transistors 112 and 124.

The maximum output voltage swing of driver 102 will be approximately equal to the current I1 times the resistance R1 (i.e., I1*R1), with the common mode voltage approximately equal to the supply voltage (Vdd) minus the current I1 times the resistance R1 divided by two (i.e., Vdd-I1*R1/2). However, when a large voltage swing (e.g., I2*R2) for receiver 104 is desired, differential transistor pair 122 may operate in its linear region and the gain will be limited due to the transistors' low threshold voltage ($V_T$).

As a specific example, if the supply voltage Vdd equals 1.2 V, the output voltage swing of driver 102 equals 200 mV, the threshold voltage ($V_T$) of differential transistor pair 122 equals 100 mV, and the desired voltage swing for output signals 110 equals ±500 mV, then the common mode voltage for driver 102 will be equal to 1.1 V (i.e., 1.2V−200 mV/2), the desired common mode voltage for receiver 104 equals 950 mV (i.e., 1.2V−500 mV/2), and an average gate-to-drain voltage (Vgd) of differential transistor pair 122 would be approximately 150 mV (i.e., 1.1 V−950 mV), which is greater than the 100 mV threshold voltage ($V_T$) of differential transistor pair 122. Consequently, differential transistor pair 122 will be forced into the linear operating region (rather than the preferred saturation region) and the gain of receiver 104 will be reduced dramatically. As a result, there is a need for improved CML buffer techniques.

SUMMARY

Systems and methods are disclosed herein to provide current mode logic buffers and interface circuits. For example, in accordance with an embodiment of the present invention, a CML buffer is disclosed that receives and/or provides multiple signal pairs having different common mode voltages. Consequently, the CML buffer operates over a wider common mode voltage range.

More specifically, in accordance with one embodiment of the present invention, a current mode logic buffer includes a first circuit adapted to receive and/or provide at least a first and a second signal pair, wherein a common mode voltage level of the second signal pair is less than a common mode voltage level of the first signal pair.

In accordance with another embodiment of the present invention, a buffer includes a first transistor pair adapted to receive an input signal and provide a first signal; a level shift circuit adapted to receive the first signal and provide a second signal having a lower common mode voltage than the first signal; a second transistor pair adapted to receive the first signal; and a third transistor pair adapted to receive the second signal, wherein the second and third transistor pair are adapted to provide an output signal.

In accordance with another embodiment of the present invention, a method of providing a signal interface includes receiving an input signal; converting the input signal to a first signal and a second signal, the second signal having a lower common mode voltage than the first signal; and driving a third signal through the signal interface, wherein a value of the third signal is based on the first signal and the second signal.

In accordance with another embodiment of the present invention, a method of providing a signal interface includes receiving a first input signal pair and a second input signal pair, wherein the second input signal pair has a lower common mode voltage than the first input signal pair; converting the first input signal pair and the second input signal pair to a first signal pair and a second signal pair, wherein the second signal pair has a lower common mode voltage than the first signal pair; and driving the first signal pair and the second signal pair through the signal interface.

In accordance with another embodiment of the present invention, a current mode logic buffer includes means for receiving at least a first input signal; and means for providing at least a first output signal based on the first input signal, wherein the providing means and/or the receiving means is adapted for signals having different common mode voltages.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 2:
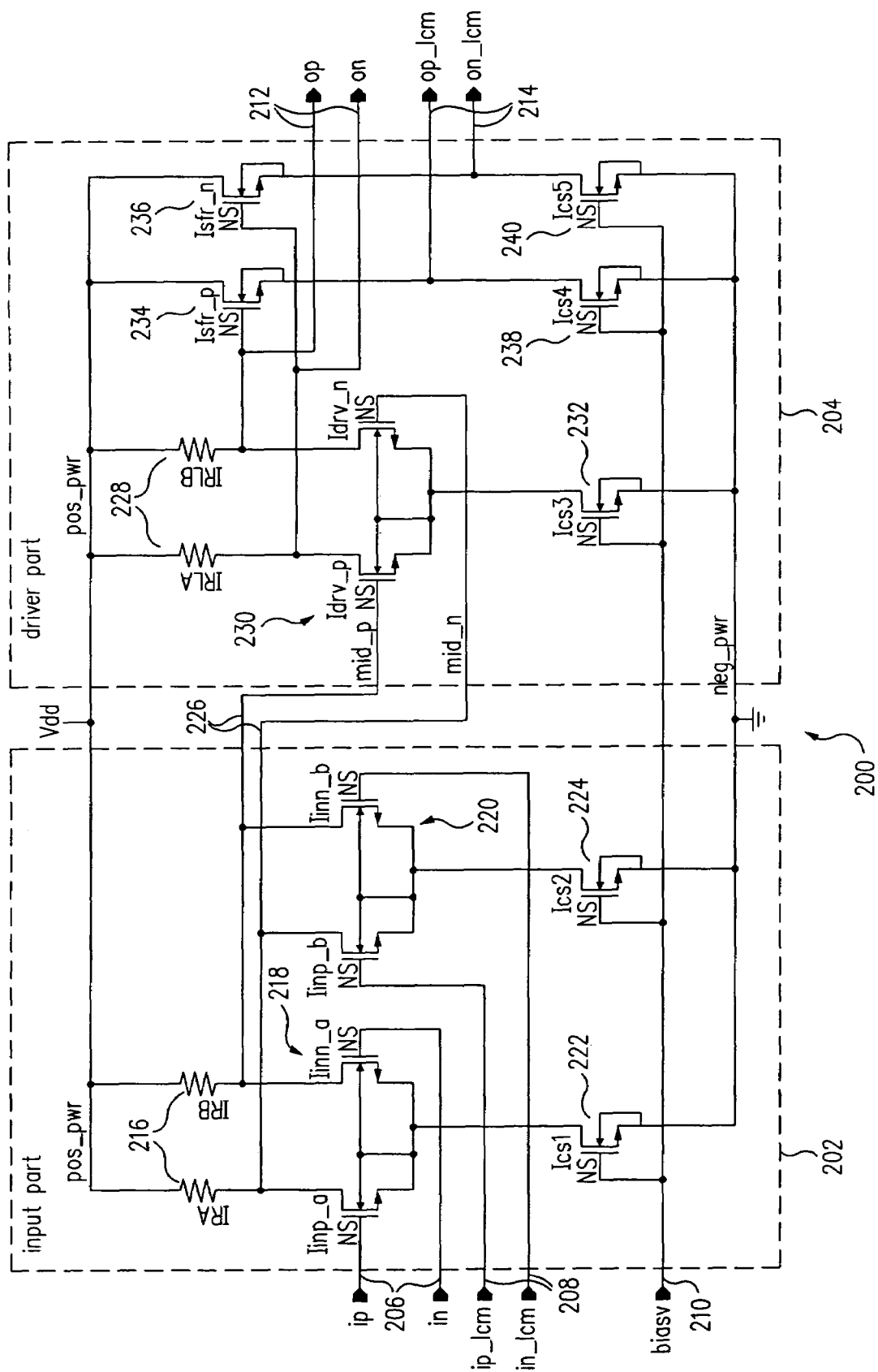
FIG. 2 shows a circuit diagram illustrating a current mode logic system in accordance with an embodiment of the present invention.

FIG. 2 shows a circuit diagram illustrating a current mode logic (CML) system 200 in accordance with an embodiment of the present invention. System 200 includes a first circuit 202 (e.g., an input part) and a second circuit 204 (e.g., a driver part) and may be viewed as a single CML buffer (e.g., first circuit 202 and second circuit 204 form one CML buffer) or as two separate CML buffers (e.g., first circuit 202 forms one CML buffer and second circuit 204 forms another CML buffer), depending upon the desired application and configuration as described further herein.

First circuit 202 includes resistors 216, differential transistor pairs 218 and 220, and current bias transistors 222 and 224. Differential transistor pairs 218 and 220 receive corresponding input signals 206 and 208 (e.g., two signal pairs having different common mode signal levels) and provide signals 226. As an example, input signals 208 form a signal pair having a lower common mode voltage than the signal pair formed by input signals 206.

Second circuit 204 includes resistors 228, a differential transistor pair 230, transistors 234 and 236, and current bias transistors 232, 238, and 240. Second circuit 204 receives signals 226 and provides output signals 212 and 214. One or more control signals 210 are provided to current bias transistors 222, 224, 232, 238, and 240 to control the amount of current flowing through these transistors. A supply voltage (Vdd or labeled pos_pwr) is provided to first circuit 202 and second circuit 204, which are also coupled to a reference voltage (e.g., ground and labeled neg_pwr).

Transistors 234 and 236, configured as source followers, function as level shift circuitry to provide output signals 214 having a lower common mode voltage than output signals 212. Consequently, system 200 may be viewed as a CML buffer having a wide common mode range (e.g., for input and/or output signals as discussed herein).

Figure 1:
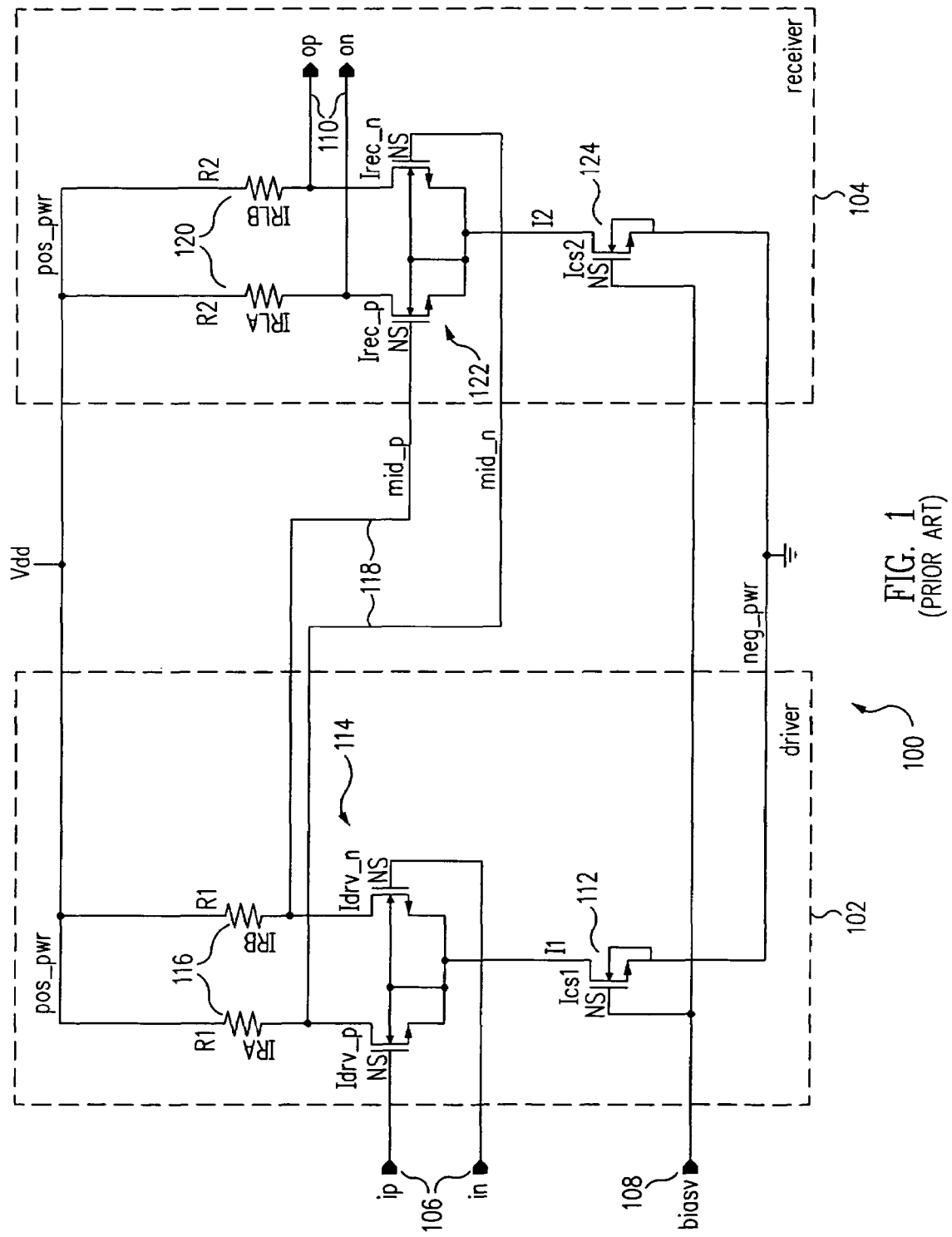
FIG. 1 shows a circuit diagram illustrating a conventional current mode logic system.

For example, a conventional CML system, such as described in reference to FIG. 1, operates with a fixed common mode voltage based on conventional common mode logic. In general, as an example, driver 102 offers a high common mode voltage, while receiver 104 prefers a lower common mode voltage to avoid having its transistors operating in the linear region. Thus, there may be a discrepancy or conflict in common mode voltage preferences between a prior stage CML buffer and a follow-on stage CML buffer, which may result in a reduced voltage swing at the CML buffer output and limit the performance (e.g., speed) that the technology is able to provide. In contrast, system 200 and one or more other embodiments disclosed herein, may resolve this issue by providing (and/or receiving) both high and low common mode voltage signals, as discussed herein.

Depending upon the desired application, second circuit 204 may provide only output signals 212 or output signals 214. For example, output signals 214 provided by the level shift circuitry, which includes transistors 234 and 236, may be provided as the only signal pair from second circuit 204.

However, depending upon the current bias, system 200 (e.g., one or more of the differential transistor pairs) may transition from the saturation region to the linear region, depending upon the PVT conditions, which may reduce the gain and overall performance of system 200. Consequently, depending upon the application, output signals 212, output signals 214, or output signals 212 and 214 may be required to meet the desired requirements.

System 200 may be implemented in a number of different configurations, depending upon the desired application and requirements. For example, system 200 may be viewed as a single CML buffer that receives input signals 206 and 208 and provides output signals 212 and 214. System 200 may also be viewed as two CML buffers, with first circuit 202 being a driver and second circuit 204 being a receiver to form a CML interface. For this exemplary implementation, first circuit 202 and second circuit 204 may be in close proximity or may be located apart, such as for example on separate integrated circuits.

Figure 3:
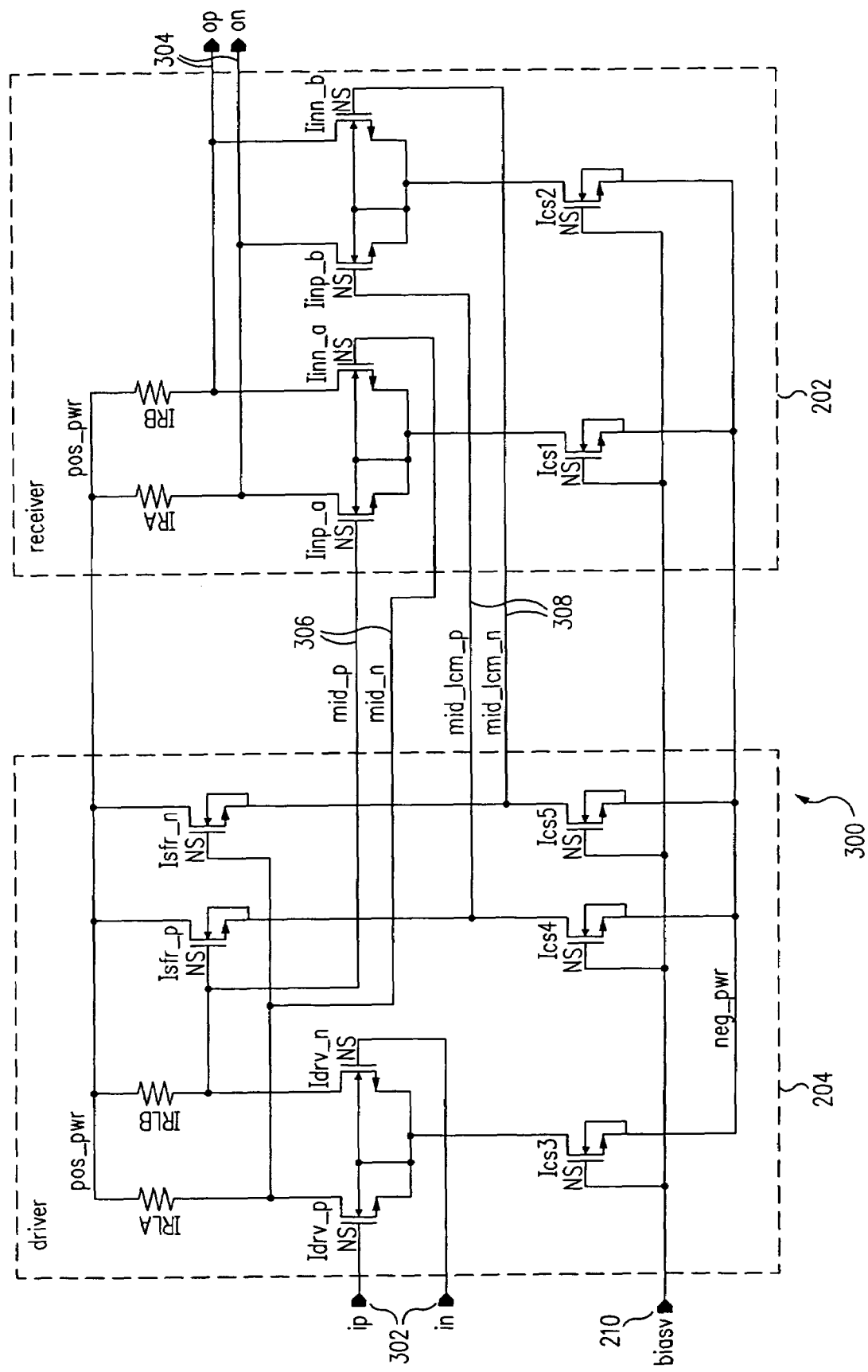
FIG. 3 shows a circuit diagram illustrating a current mode logic system in accordance with an embodiment of the present invention.

Alternatively, in accordance with an embodiment of the present invention, second circuit 204 and first circuit 202 may be implemented as a driver and a receiver, respectively, such as in the exemplary CML system 300 illustrated in FIG. 3. System 300 receives input signals 302 and provides output signals 304, with second circuit 204 providing signals 306 and 308 to first circuit 202.

Figure 4A:
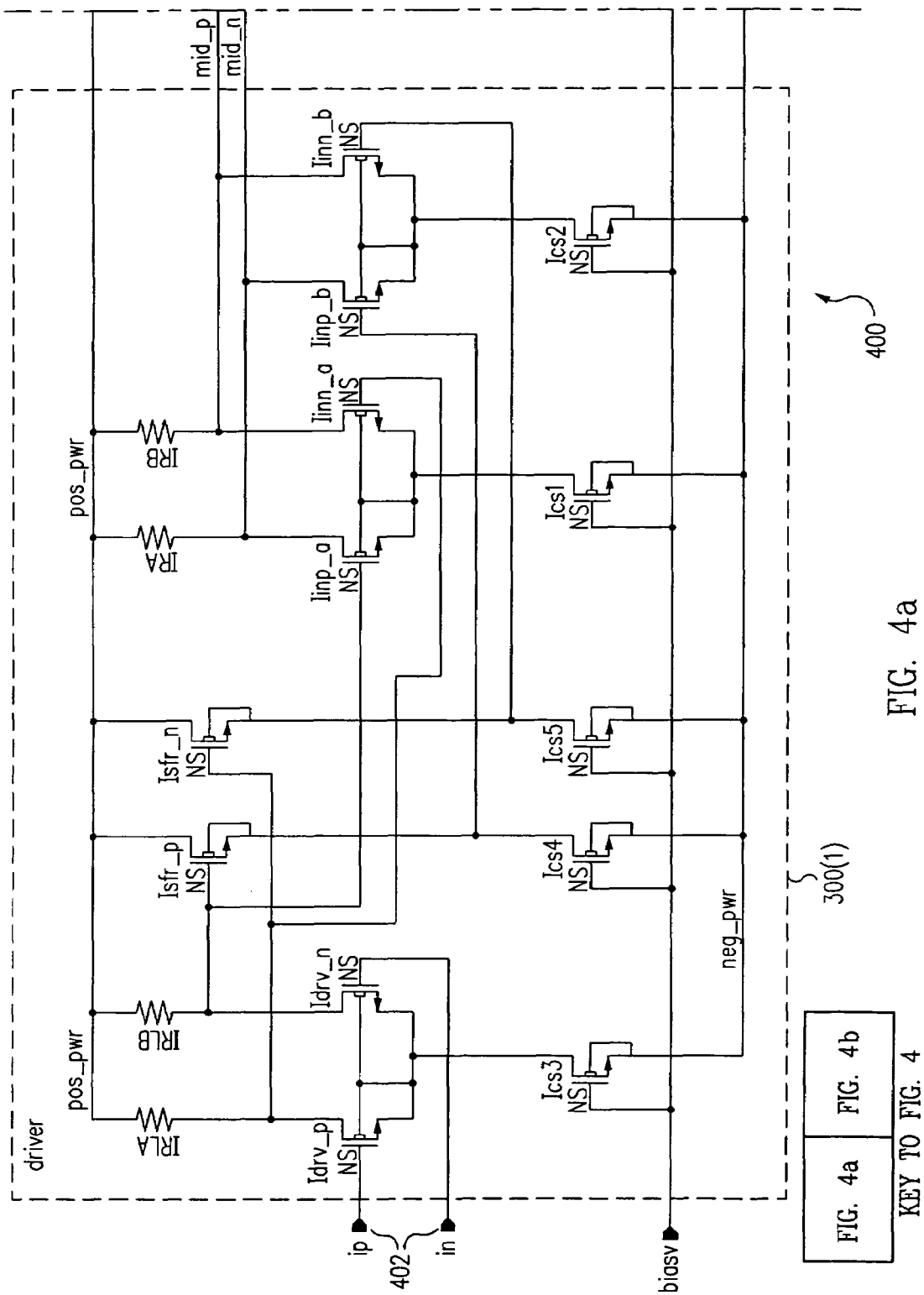
FIG. 4 shows a circuit diagram illustrating a current mode logic system in accordance with an embodiment of the present invention.
Figure 4B:
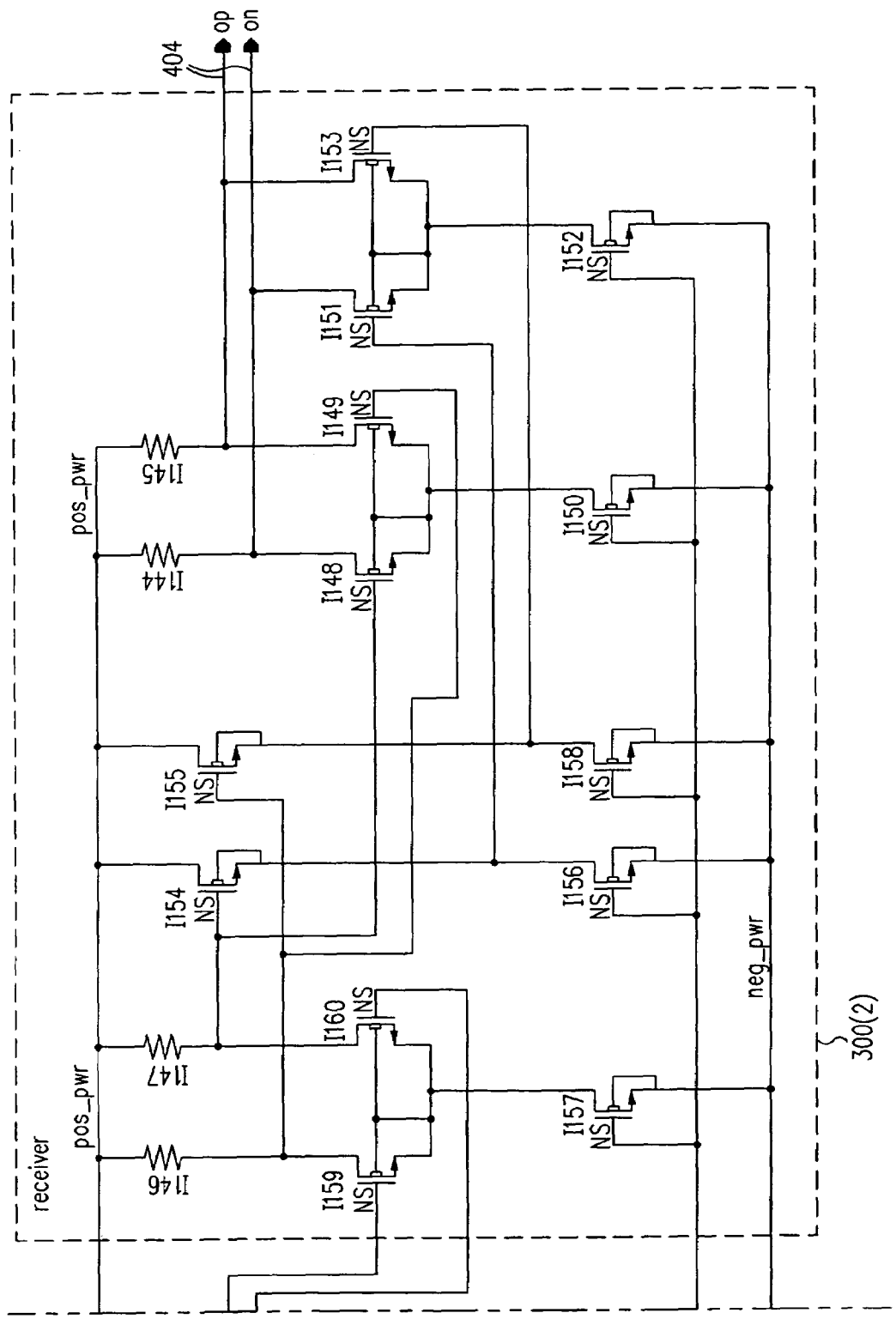

System 300 may also be viewed as a single CML buffer formed by second circuit 204 and first circuit 202. For example, in accordance with an embodiment of the present invention, FIG. 4 shows a CML system 400 with two systems 300 (which are separately referenced as 300(1) and 300(2)), with system 300(1) functioning as a driver and system 300(2) functioning as a receiver to form a CML interface. System 300(1) receives input signals 402 and system 300(2) provides output signals 404.

Figure 5A:
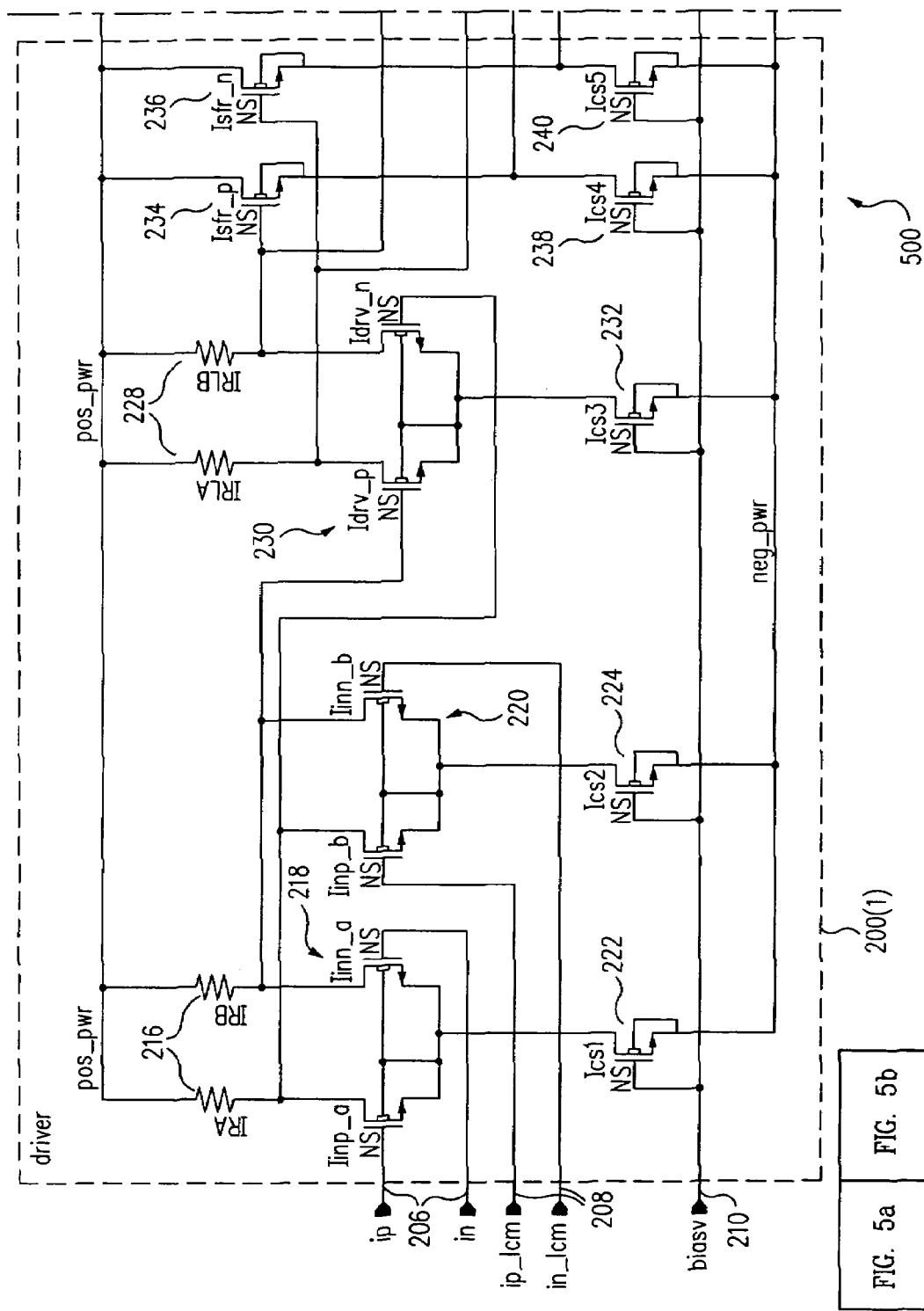
FIG. 5 shows a circuit diagram illustrating a current mode logic system in accordance with an embodiment of the present invention.
Figure 5B:
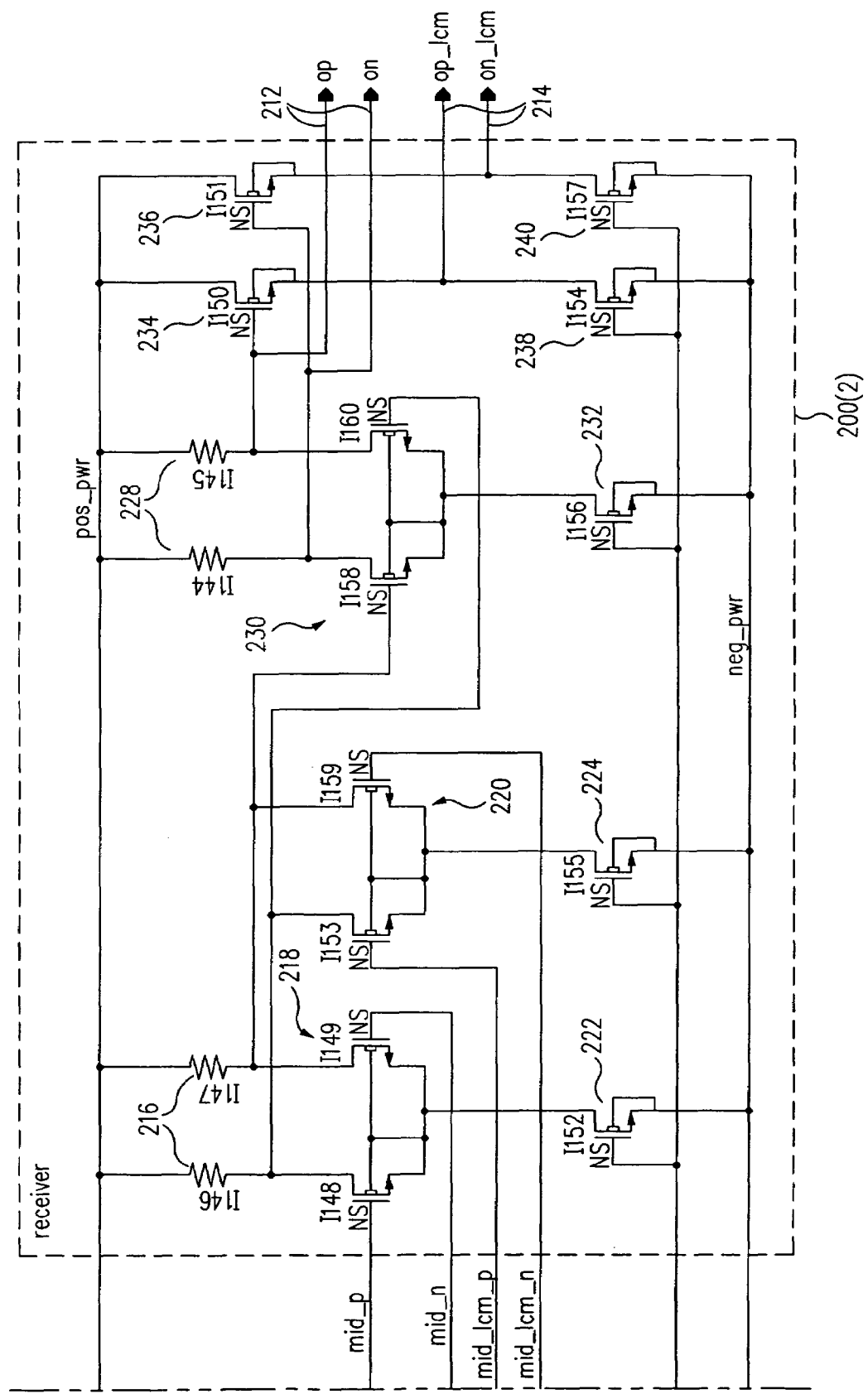

In a similar fashion, in accordance with an embodiment of the present invention, FIG. 5 shows a CML system 500 with two systems 200 (which are separately referenced as 200(1) and 200(2)), with system 200(1) functioning as a driver and system 200(2) functioning as a receiver to form a CML interface. System 200(1) receives input signals 206 and 208 and system 200(2) provides output signals 212 and 214.

Figure 6A:
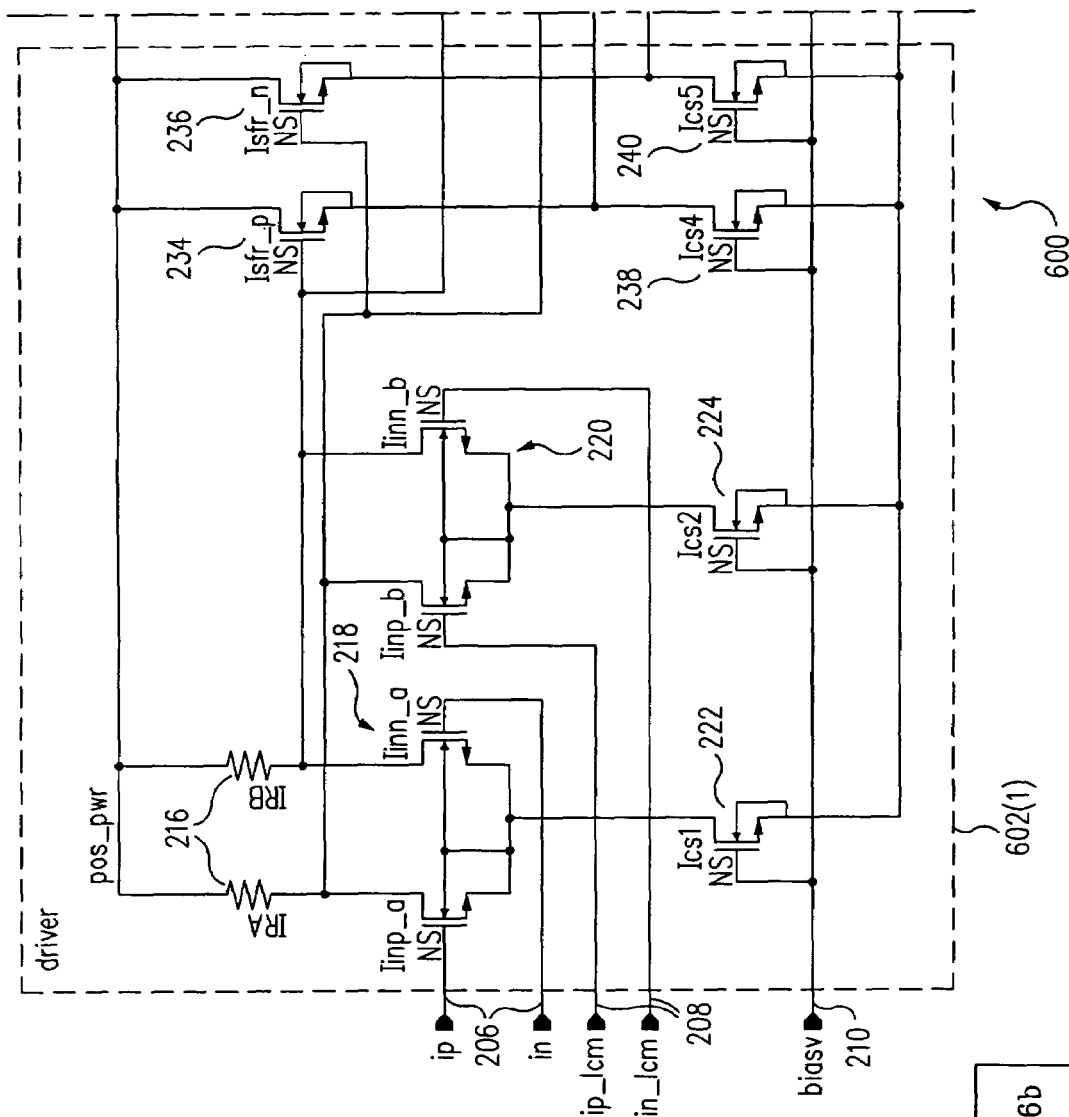
FIG. 6 shows a circuit diagram illustrating a current mode logic system in accordance with an embodiment of the present invention.
Figure 6B:
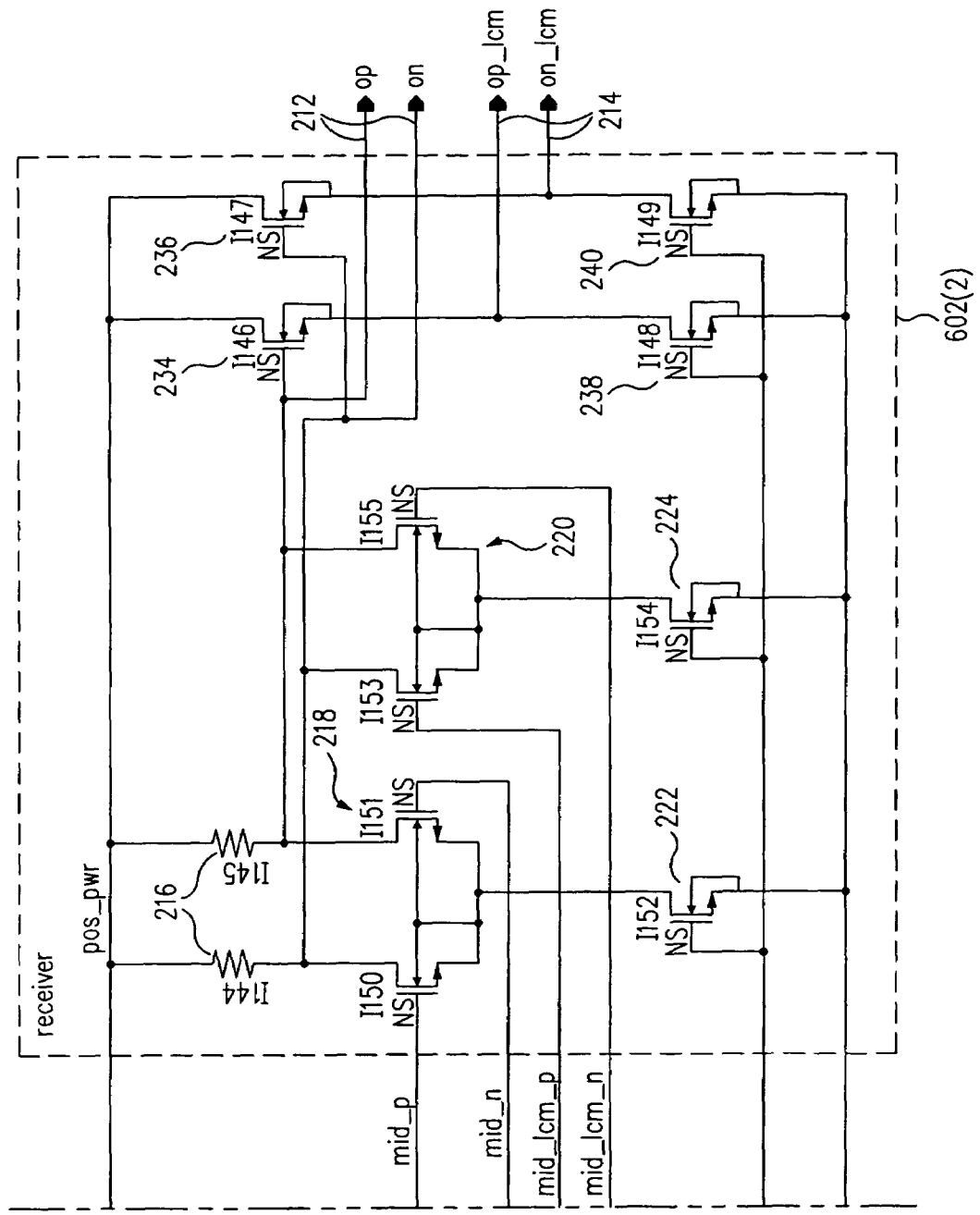

FIG. 6 shows a circuit diagram illustrating a CML system 600 in accordance with an embodiment of the present invention. System 600 includes systems 602 (which are separately referenced as 602(1) and 602(2)), with systems 602(1) and 602(2) functioning as a driver and a receiver, respectively, to form a CML interface.

System 600 is similar to system 500, but unlike system 200, system 602 does not include resistors 228, differential transistor pair 230, or current bias transistor 232. These additional circuit elements, which function as an additional signal driver within system 200, may not be required depending upon the desired application and its requirements. Furthermore, it should be understood that the exemplary circuit implementations disclosed herein are not limiting and numerous variations are possible based on the disclosed techniques.

In accordance with an embodiment of the present invention, CML buffers and systems are disclosed that may provide a wide common mode range (e.g., over PVT conditions). For example, a CML buffer is disclosed having level shift circuitry and a number of differential transistor pairs to widen the CML input/output common mode range and provide an improved interface for different common mode signals. The CML buffer techniques disclosed herein are not limiting and may be applied in a number of different applications and configurations, such as for example those discussed herein.

Embodiments described above illustrate but do not limit the invention. It should also be understood that numerous modifications and variations are possible in accordance with the principles of the present invention. Accordingly, the scope of the invention is defined only by the following claims.

I claim:

1. A current mode logic buffer comprising:
   a first circuit adapted to receive and/or provide at least a first and a second signal pair, wherein a common mode voltage level of the second signal pair is less than a common mode voltage level of the first signal pair;
   wherein the first circuit comprises:
      a first transistor pair adapted to receive an input signal pair and provide the first signal pair;
      a pair of resistors coupled to the first transistor pair;
      a level shift circuit, coupled to the first transistor pair, adapted to provide the second signal pair, wherein the level shift circuit comprises a first and a second transistor; and
      a first, second, and third bias transistor adapted to control a current level through the first transistor pair, the first transistor, and the second transistor, respectively.

2. The current mode logic buffer of claim 1, wherein the first circuit further comprises;
   a second transistor pair adapted to receive the first signal pair; and
   a third transistor pair adapted to receive the second signal pair, wherein the second and third transistor pair provide a first output signal pair.

3. The current mode logic buffer of claim 2, wherein the first circuit further comprises:
   a pair of resistors coupled to the second transistor pair; and
   a first and a second transistor coupled to the second and third transistor pair, respectively, to control a corresponding current level through the second and third transistor pair.

4. The current mode logic buffer of claim 1, wherein the first circuit is adapted to function as a driver or a receiver of a current mode logic interface.

5. The current mode logic buffer of claim 1, wherein the first circuit further comprises:
   a second transistor pair adapted to receive a second input signal pair, wherein the first and second transistor pair provide the first signal pair; and
   wherein the level shift circuit, coupled to the first and second transistor pair, is adapted to provide the second signal pair, wherein a common mode voltage level of the second signal pair is less than a common mode voltage level of the first signal pair.

6. The current mode logic buffer of claim 5, wherein the current mode logic buffer is adapted to provide a current mode logic interface, with one of the current mode logic buffers functioning as a driver and another functioning as a receiver.

7. The current mode logic buffer of claim 1, wherein the first circuit further comprises:
   a second transistor pair adapted to receive a second input signal pair, wherein the first and second transistor pair provide the first signal pair;
   a third transistor pair adapted to receive the first signal pair and provide a first output signal pair; and
   wherein the level shift circuit, coupled to the third transistor pair, is adapted to provide the second signal pair, wherein a common mode voltage level of the second signal pair is less than a common mode voltage level of the first signal pair.

8. The current mode logic buffer of claim 7, wherein the current mode logic buffer is adapted to provide a current mode logic interface, with one of the current mode logic buffers functioning as a driver and another functioning as a receiver.

9. A buffer comprising:
   a first transistor pair adapted to receive an input signal and provide a first signal;
   a level shift circuit adapted to receive the first signal and provide a second signal having a lower common mode voltage than the first signal;
   a second transistor pair adapted to receive the first signal; and
   a third transistor pair adapted to receive the second signal, wherein the second and third transistor pair are adapted to provide an output signal.

10. The buffer of claim 9, wherein the input signal, the first signal, the second signal, and the output signal each comprise signal pairs.

11. The buffer of claim 9, wherein the buffer is adapted to function as a driver or a receiver for a current mode logic interface.

12. The buffer of claim 9, further comprising:
   a first pair of resistors coupled to the first transistor pair;
   a second pair of resistors coupled to the second transistor pair; and
   a plurality of current bias transistors adapted to control a current level through the first, second, and third transistor pair and the level shift circuit.

13. A method of providing a signal interface, the method comprising:
   receiving an input signal;
   converting the input signal to a first signal and a second signal, the second signal having a lower common mode voltage than the first signal;
   driving a third signal through the signal interface, wherein a value of the third signal is based on the first signal and the second signal;
   receiving the third signal;
   converting the third signal to a fourth signal and a fifth signal, the fifth signal having a lower common mode voltage than the fourth signal; and
   providing an output signal, wherein a value of the output signal is based on the fourth signal and the fifth signal.

14. The method of claim 13, wherein the signal interface comprises a current mode logic signal interface.

15. A method of providing a signal interface, the method comprising:
   receiving a first input signal pair and a second input signal pair, wherein the second input signal pair has a lower common mode voltage than the first input signal pair;
   converting the first input signal pair and the second input signal pair to a first signal pair and a second signal pair, wherein the second signal pair has a lower common mode voltage than the first signal pair;
   driving the first signal pair and the second signal pair through the signal interface; receiving the first signal pair and the second signal pair; and
   converting the first signal pair and the second signal pair to a first output signal pair and a second output signal pair, wherein the second output signal pair has a lower common mode voltage than the first output signal pair.

16. The method of claim 15, wherein the signal interface comprises a current mode logic signal interface.

17. A current mode logic buffer comprising:
means for receiving at least a first input signal;
means for providing at least a first and a second output signal based on the first input signal, wherein the providing means and/or the receiving means is adapted for signals having different common mode voltages;
means for shifting a common mode voltage level of the at least first output signal; and
means for biasing to control a current level through the receiving means, the providing means, and the shifting means.

18. The current mode logic butter of claim 17, wherein the receiving means receives the first input signal, the providing means provides the first output signal, and the signals comprise two simultaneous signals having different common mode voltages.

19. The current mode logic buffer of claim 18, wherein the signals are based on the first input signal, and the first output signal is based on the signals.

20. The current mode logic buffer of claim 17, wherein the receiving means receives the first input signal and a second input signal having a different common mode voltage than the first input signal.

21. The current mode logic buffer of claim 17, wherein the providing means provides the first output signal and the second output signal having a different common mode voltage than the first output signal.

22. The current mode logic buffer of claim 17, wherein the receiving means receives the first input signal and a second input signal having a different common mode voltage than the first input signal, and the providing means provides the first output signal and the second output signal having a different common mode voltage than the first output signal.

* * * * *